United States Patent
Wilson et al.

(10) Patent No.: US 8,736,379 B1
(45) Date of Patent: May 27, 2014

(54) INPUT MATCH NETWORK FOR A POWER CIRCUIT

(71) Applicant: Infineon Technologies North America Corp., Milpitas, CA (US)

(72) Inventors: Richard Wilson, Morgan Hill, CA (US); Saurabh Goel, Campbell, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/763,373

(22) Filed: Feb. 8, 2013

(51) Int. Cl.
*H03F 3/191* (2006.01)

(52) U.S. Cl.
USPC .......................................... 330/302; 330/277

(58) Field of Classification Search
USPC .................................................. 330/302, 277
See application file for complete search history.

(56) References Cited

U.S. PATENT DOCUMENTS

| | | | | |
|---|---|---|---|---|
| 3,792,384 A * | 2/1974 | Hunt | ............................. | 333/238 |
| 4,559,503 A * | 12/1985 | Camand et al. | ............... | 330/302 |
| 4,609,887 A * | 9/1986 | Taralp | ......................... | 333/28 R |
| 5,661,434 A * | 8/1997 | Brozovich et al. | ............. | 330/51 |
| 7,612,616 B2 * | 11/2009 | Deng et al. | ..................... | 330/302 |
| 2011/0062336 A1 * | 3/2011 | Ben-Bassat | ............... | 250/338.4 |

* cited by examiner

*Primary Examiner* — Patricia Nguyen
(74) *Attorney, Agent, or Firm* — Murphy, Bilak & Homiller, PLLC

(57) ABSTRACT

A power circuit includes a RF transistor and an input match network coupled to an input to the RF transistor and to an input to the power circuit. The input match network includes a resistor, an inductor and a capacitor that are coupled together in series between the input to the RF transistor and a ground. The values of the resistor and the inductor are selected to match an input impedance of the RF transistor to a source impedance at the input to the power circuit over at least a portion of a high frequency range, wherein the value of the capacitor has a substantially negligible contribution to the match at the high frequency range. The value of the capacitor is selected so that the series combination of the resistor, the inductor and the capacitor substantially reduce the magnitude of the impedance presented to the input of the RF transistor in a low frequency range relative to the source impedance at the input to the power circuit.

17 Claims, 6 Drawing Sheets

INPUT MATCH NETWORK FOR A POWER CIRCUIT

FIELD OF TECHNOLOGY

The present application relates to RF (radio frequency) amplifiers, in particular input match networks for RF amplifiers.

BACKGROUND

RF power amplifiers are used in a variety of applications such as base stations for wireless communication systems etc. The signals amplified by the RF power amplifiers often include signals that have a high frequency modulated carrier having frequencies in the 400 megahertz (MHz) to 4 gigahertz (GHz) range. The baseband signal that modulates the carrier is typically at a relatively lower frequency and, depending on the application, can be up to 300 MHz or higher.

RF power amplifiers are designed to provide linear operation without distortion. Input and output impedance matching circuits are used to match RF transistors that may have low input and output impedances (e.g., around 1 ohm or less for high power devices), to external transmission lines that provide RF signals to and from the RF transistor. These external transmission lines have characteristic impedances that are typically 50 ohms but could be any value as decided by a designer. The input and output matching circuits typically include inductive and capacitive elements that are used to provide impedance matching between the input and output of the RF power amplifier and the input and output of the RF transistor. The input and output matching circuits provide impedance matching for the signal frequencies that are amplified by the RF power amplifier, such as those in the 400 MHz to 4 GHz range.

The use of impedance matching circuits, however, can cause unintended consequences that occur outside of the range of signal frequencies that the impedance match is being provided for. For example, a typical output match network will include a blocking capacitor for blocking DC. The blocking capacitor in combination with the RF transistor drain bias inductance creates a low frequency resonance. This low frequency resonance causes the impedance in the low frequency region to increase. As a result, the frequency response of the RF power amplifier has a low frequency gain spike. Such a spike can appear anywhere from a few MHz to hundreds of MHz. The output of a nonlinear operation yields terms with frequencies at the sum and difference of the original signal frequencies, plus the original frequencies and multiples of the original frequencies, and those multiples are commonly referred to as harmonics. Current wireless signals have high modulation bandwidths. The second order distortion components of such wideband signals may fall in the region of the low frequency gain spike. Further, in most wireless communication applications distortion correction systems such as DPD or Digital Pre-Distortion are used. Such systems model the power amplifier, predict the non-linear performance and adjust the signal characteristics to reduce the distortion at the PA system output. The undesired high gain (or high impedance) in the baseband region due to the low frequency resonance negatively impacts the RF transistor and pre-distortion performance of the overall system.

A resonance in baseband frequency region causes a sharp change in gain at these low frequencies. The frequency at which the low frequency gain peak occurs is typically known as the video bandwidth of the RF power amplifier. Moreover, the magnitude of the gain peak also impacts the system performance. A higher magnitude of gain peak results in worse overall system performance. Additionally, the resonance in the baseband frequency region causes high peak voltages at the drain of RF transistors such as LDMOS (laterally-diffused metal-oxide semiconductor) transistors. These high peak voltages at the drain of the RF transistor can surpass the breakdown voltage of the device under certain conditions causing failures. Consequently, any increase of the gain peak within the low frequency baseband region can effectively reduce the ruggedness of the power device.

SUMMARY

According to an embodiment of a power circuit, the power circuit includes a RF transistor and an input match network coupled to an input to the RF transistor and to an input to the power circuit. The input match network includes a resistor, an inductor and a capacitor that are coupled together in series between the input to the RF transistor and a ground. The values of the resistor and the inductor are selected to match an input impedance of the RF transistor to a source impedance at the input to the power circuit over at least a portion of a high frequency range, wherein the value of the capacitor has a substantially negligible contribution to the match at the high frequency range. The value of the capacitor is selected so that the series combination of the resistor, the inductor and the capacitor substantially reduce the magnitude of the impedance presented to the input of the RF transistor in a low frequency range relative to the source impedance at the input to the power circuit.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
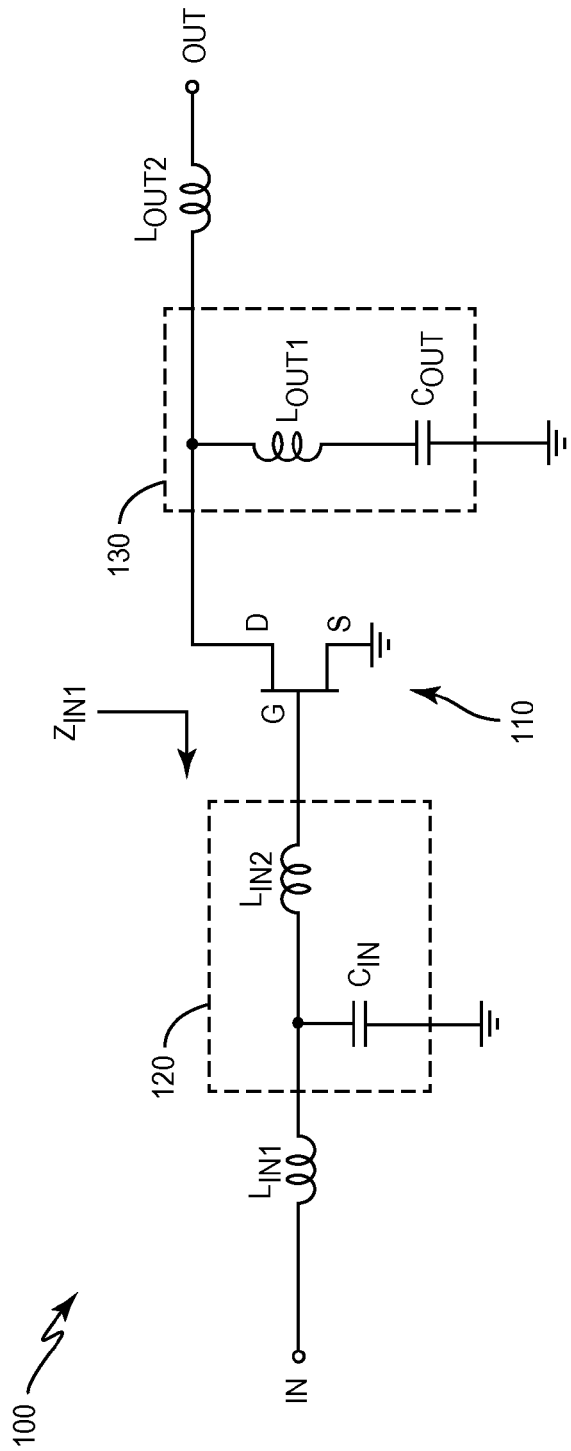
FIG. 1 illustrates a conventional power circuit.

FIG. 1 illustrates a conventional power circuit 100 that includes a RF transistor 110, an input match network 120 and an output match network 130. Input match network 120 provides impedance matching between input terminal (IN) and a gate (G) of RF transistor 110, and output match network 130 provides impedance matching between a drain (D) of RF transistor 110 and output terminal (OUT). The impedance matching is provided for a desired RF signal bandwidth (also referred to as the RF region). The RF region for signals that are amplified by power circuit 100 can be in the 400 MHz to 4 GHz range. The RF region for different applications can be lower or higher than the aforementioned range.

Input match network 120 includes a matching capacitor $C_{IN}$ having one terminal coupled to ground. A branch $L_{IN2}$ of the input match network 120 is coupled to the other terminal of $C_{IN}$ and to the gate (G) of an RF transistor 110. A branch $L_{IN1}$ couples the input terminal (IN) of the power circuit 100 to the terminal of $L_{IN2}$ and the other terminal of $C_{IN}$. The branches $L_{IN1}$ and $L_{IN2}$ of the input match network 120 are typically implemented as bond wires, ribbons, etc. The input match network 120 uses selected values for $C_{IN}$ and $L_{IN2}$ to match an input impedance of RF transistor 110 to the terminal (IN) impedance. In this illustration in FIG. 1, $C_{IN}$=10 to 100 pF, $L_{IN1}$=100 to 200 pH and $L_{IN2}$=100 to 200 pH. RF transistor 110 is a LDMOS (laterally-diffused metal-oxide semiconductor) transistor rated at 100 Watts. The magnitude of the impedance presented to the gate (G) of RF transistor 110 is designated by $Z_{IN1}$ and the reference arrow illustrates that this impedance is provided to the gate (G) terminal of the RF transistor 110. The impedance $Z_{IN1}$ will be discussed in reference to FIG. 3 and FIG. 6.

The output match network 130 includes a blocking capacitor $C_{OUT}$ and a branch $L_{OUT1}$. $L_{OUT1}$ is coupled to the drain (D) of the RF transistor 110 and to one terminal of $C_{OUT}$. The other terminal of $C_{OUT}$ is coupled to ground. A branch $L_{OUT2}$ couples the drain (D) of RF transistor 110 and one terminal of $L_{OUT1}$ to the terminal (OUT) of the power circuit 100. The source (S) of the RF transistor 110 is coupled to ground. The branches $L_{OUT1}$ and $L_{OUT2}$ of the output match network 130 can be implemented in various different ways such as bond wires, ribbons, etc. The output match network 130 uses $C_{OUT}$ and $L_{OUT1}$ to match an output impedance at the drain (D) of RF transistor 110 to a terminal (OUT) impedance within the RF region.

The output match network 130 provides high frequency impedance matching over the RF region but may also result in an undesirable low frequency gain peak outside of the RF region which corresponds to the low frequency resonance. The blocking capacitor $C_{OUT}$ cuts off DC, and the combination of LC components (e.g., including, but not limited to, inductance from voltage connections external to power circuit 100, branch $L_{OUT1}$ and branch $L_{OUT2}$) with the DC blocking capacitance form resonances, resulting in a high gain peak and high peak voltages at the drain of RF transistor 110 at frequencies in the low frequency baseband region.

This high gain peak in the baseband frequency region can cause the peak drain voltage of RF transistor 110 to surpass the breakdown voltage of the device under certain conditions, e.g., when unintended system artifacts appearing in the region of the low frequency gain peak are strongly amplified, when a baseband component of a broadband signal that is coincident with the low frequency gain response peak is strongly amplified by the gain peak, etc. It will be appreciated that this problem cannot be completely solved with a more complex matching circuit that suppresses low frequency signals before they reach the output terminal, since the excessively high low-frequency signals will still be present at the output of the transistor.

Figure 2:
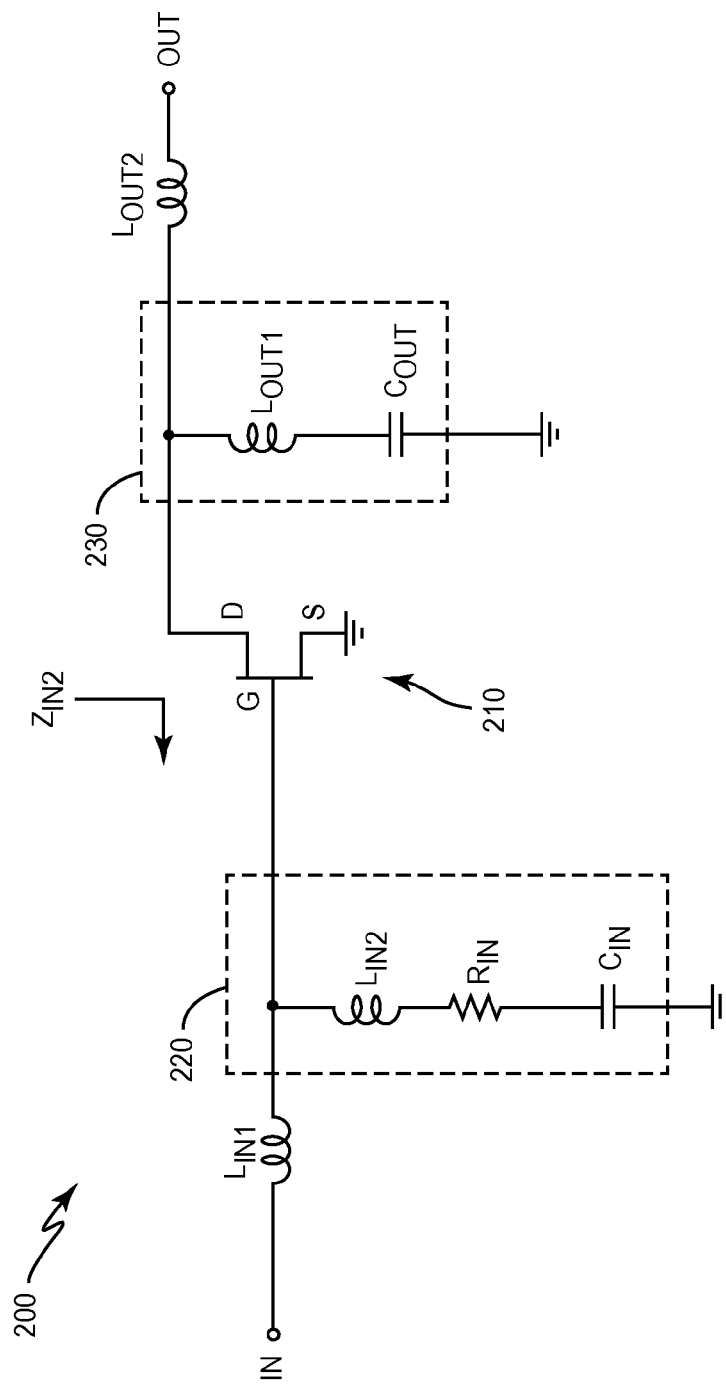
FIG. 2 illustrates an embodiment of a power circuit.

FIG. 2 illustrates an embodiment of a power circuit 200. The power circuit 200 includes a RF transistor 210, an input match network 220 and an output match network 230. Input match network 220 provides impedance matching between input terminal (IN) and a gate (G) of RF transistor 210, and output match network 230 provides impedance matching between a drain (D) of RF transistor 210 and output terminal (OUT). The impedance matching is provided for a desired RF signal bandwidth or RF region. In other embodiments, the impedance matching is provided for at least a portion of a desired RF signal bandwidth or RF region. The RF region for signals that are amplified by power circuit 200 can be in the 400 MHz to 4 GHz range. The RF region for different applications can be lower or higher than the aforementioned range.

The input match network 220 is coupled between an input inductor $L_{IN1}$ of power circuit 200 and a gate (G) of RF transistor 210. In various embodiments, the input inductor $L_{IN1}$ is implemented as bond wires, ribbons etc. which couple the input match network 220 to a terminal (IN) of the power circuit 200. In many cases $L_{IN1}$ is a part of the input match network. The output match network 230 is coupled between a drain (D) of RF transistor 210 and an output inductor $L_{OUT2}$ of the power circuit 200. In various embodiments, the output inductor $L_{OUT2}$ is implemented as bond wires, ribbons etc. which couple the output match network 230 to a terminal (OUT) of the power circuit 200. In many cases $L_{OUT2}$ is a part of the output match network. Output match network 230 is similar to output match network 130 discussed in reference to FIG. 1. The magnitude of the impedance presented to the gate (G) of RF transistor 210 is designated by $Z_{12}$ and the reference arrow illustrates that this impedance is provided to gate (G) of RF transistor 210. The impedance $Z_{IN2}$ will be discussed in reference to FIG. 3 and FIG. 6.

In various embodiments, RF transistor 210 can be a power transistor such as a MOSFET (metal-oxide semiconductor field-effect transistor), DMOS (double-diffused metal-oxide semiconductor) transistor, GaN HEMT (gallium nitride high electron mobility transistor), GaN MESFET (gallium nitride metal-semiconductor field-effect transistor), LDMOS transistor, etc. and more generally any type of RF transistor device. RF transistor 210 and the complete power circuit 200 can be a multi-carrier amplifier, a multiband amplifier, an LTE (long term evolution) compliant amplifier, a WCDMA (wideband code division multiple access) compliant amplifier, an 802.11(x) compliant amplifier, etc.

Input match network 220 includes a blocking capacitor $C_{IN}$, a resistance $R_{IN}$ and an inductance $L_{IN2}$. In this embodiment, $C_{IN}$, $R_{IN}$ and $L_{IN2}$ are coupled in series between a gate (G) of RF transistor 210 and ground. Although the illustrated embodiment shows this series connection with one terminal of $C_{IN}$ coupled to ground and one terminal of $L_{IN2}$ coupled to a gate (G) of RF transistor 210 with $R_{IN}$ coupled between a second terminal of $L_{IN2}$ and a second terminal of $C_{IN}$, in other embodiments, $C_{IN}$, $R_{IN}$ and $L_{IN2}$ can be coupled between ground and gate (G) of RF transistor 210 in other suitable configurations.

The branch $L_{IN2}$ of input match network 220 can be implemented as bond wires, ribbons, etc. In various embodiments, the branch $L_{IN2}$ can be implemented as other suitable inductors. The blocking capacitor $C_{IN}$ of the input match network 220 can be implemented as a discrete component separate from RF transistor 210 or can be integrated with RF transistor 210 on the same die. Resistance $R_{IN}$ and inductance $L_{IN2}$ can be implemented as discrete components or distributed components separate from the RF transistor 210 or can be integrated with the RF transistor 210 on the same die. In one embodiment, resistance $R_{IN}$ and inductance $L_{IN2}$ provide input match compensation for the parasitic capacitances of RF transistor 210 including, but not limited to, the gate (G) to source (S) capacitance of RF transistor 210. The input match network 220 can have other configurations which are within the scope of the embodiments described herein.

Input match network 220 provides a low impedance at the gate (G) of RF transistor 210 over the baseband frequency range, e.g., between 0 to 300 MHz, and reduces a gain response peak within this frequency range, which may result in lower peak voltages at the drain (D) of RF transistor 210. Input match network 220 provides an impedance match between terminal (IN) and a gate (G) of RF transistor 210 over a range of signal frequencies that are amplified by power circuit 200. In other embodiments, input match network 220 provides an impedance match between terminal (IN) and a gate (G) of RF transistor 210 over at least a portion of a range of signal frequencies that are amplified by power circuit 200. In one embodiment, the range of signal frequencies that are amplified by power circuit 200 are in the 1 to 3 GHz range. In another embodiment, the range of signal frequencies that are amplified by power circuit 200 are in the 400 MHz to 4 GHz range.

The values of resistor $R_{IN}$ and inductor $L_{IN2}$ are selected to create a match between an input impedance of RF transistor 210 and impedance at the terminal (IN) of power circuit 200. Within the range of signal frequencies that are in the 400 MHz to 4 GHz range, the value of capacitor $C_{IN}$ has a substantially negligible contribution to the impedance match. The value of capacitor $C_{IN}$ is selected so that the series combination of resistor $R_{IN}$, inductor $L_{IN2}$ and capacitor $C_{IN}$ substantially reduces the magnitude of the impedance presented to the gate (G) of RF transistor 210 over the baseband frequency range. In other embodiments, for different applications, the baseband frequency range can include frequencies that are greater than 300 MHz, and the RF signal bandwidth or RF region for signals that are amplified by power circuit 200 can include frequencies that are lower than 400 MHz or frequencies that are greater than 4 GHz. In the embodiment illustrated in FIG. 2, $C_{IN}$=2 nF, $R_{IN}$=0.3 ohms and $L_{IN2}$=70 pH. Because the capacitance value of $C_{IN}$ used in input match network 220 may depend on the application in which the power circuit 200 is used, in other embodiments, capacitor $C_{IN}$ can have other suitable values.

Figure 3:
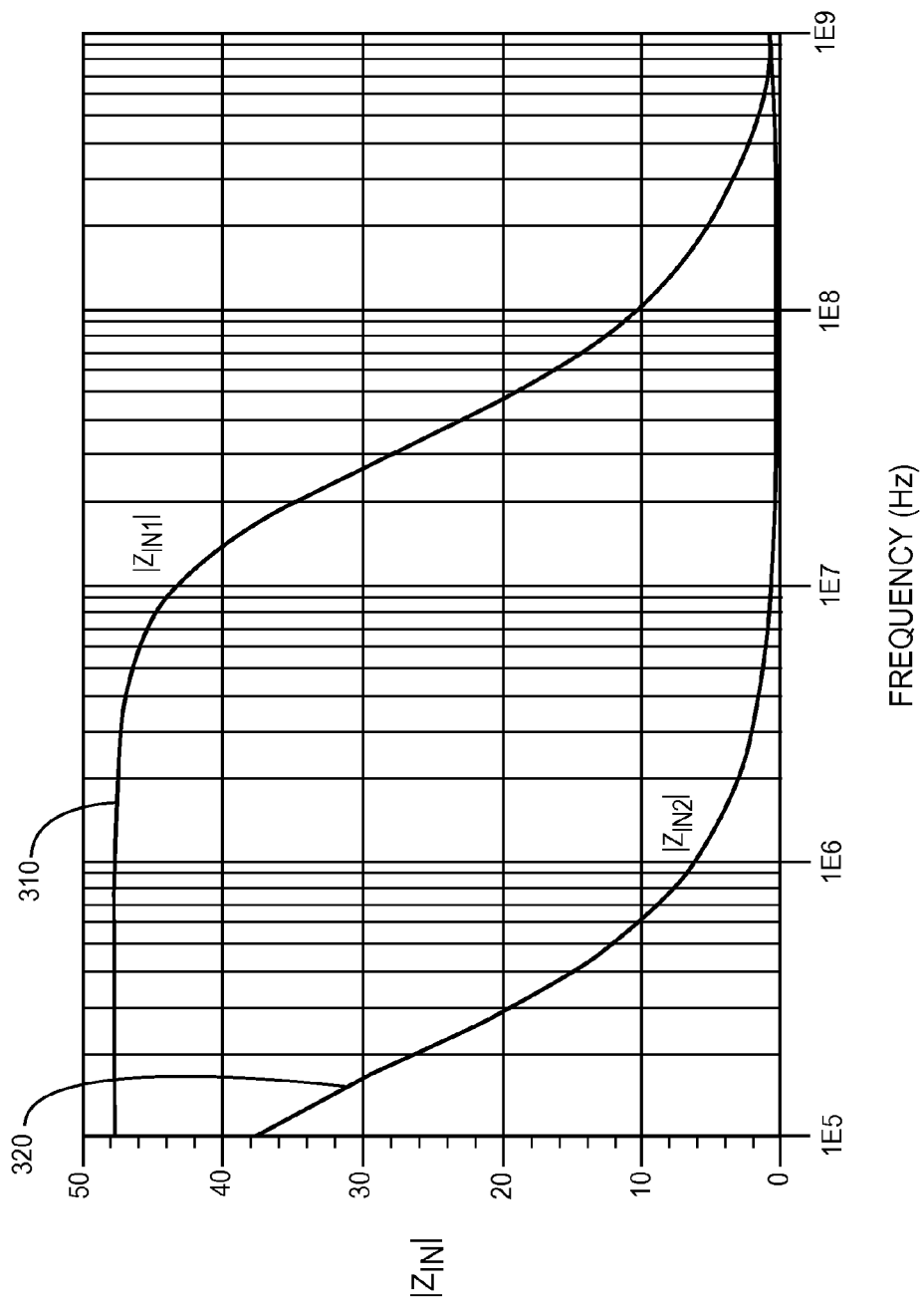
FIG. 3 illustrates the impedance at the input of the RF transistor as a function of frequency with the power circuits illustrated in FIG. 1 and FIG. 2.

FIG. 3 illustrates a baseband impedance presented to gate (G) of RF transistor 110/210 as a function of frequency and respectively with input match networks 120/220. Curve 310 illustrates the impedance at gate (G) of RF transistor 110 for power circuit 100 (refer to $Z_{IN1}$ in FIG. 1) with conventional input match network 120. Curve 320 illustrates the impedance at gate (G) of RF transistor 210 for power circuit 200 (refer to $Z_{IN2}$ in FIG. 2) for an embodiment of input match network 220 where $C_{IN}$ has a value of 2 nF. The terminals (IN) of power circuits 100/200 have a characteristic impedance of 50 ohms.

Over the baseband frequency range of 0 to 300 MHz, input match network 220 provides a much lower input impedance to gate (G) of RF transistor 210 than conventional input match network 120 provides to gate (G) of RF transistor 110. Curve 310 illustrates that with input match network 120, a maximum impedance is presented at gate (G) of RF transistor 110 of about 48 ohms (at 1 MHz). With input match network 220, curve 320 illustrates that a maximum impedance is presented at gate (G) of RF transistor 210 of about 6 ohms (at 1 MHz).

Overall the maximum impedance presented to gate (G) of RF transistor 110/210, over the low-frequency range, in comparison to the characteristic input impedance at terminal (IN) of power circuits 100/200 is much lower with input match network 220 than with input match network 120. In the illustrated embodiment, for a 100 W RF power transistor, a ratio of the magnitude of impedance $Z_{IN2}$ presented to gate (G) of RF transistor 210 to the source impedance of 50 ohms for power circuit 200 ranges from approximately 0.02 to 0.12 over a 1 to 300 MHz frequency range. In other embodiments, the ratio of the magnitude of impedance $Z_{IN2}$ presented to gate (G) of RF transistor 210 to the source impedance of 50 ohms for power circuit 200 has a maximum value of 0.4 over the 1 to 300 MHz frequency range. In other embodiments, a ratio of the magnitude of impedance $Z_{IN2}$ presented to gate (G) of RF transistor 210 to the source impedance of 50 ohms for power circuit 200 ranges from approximately 0.02 to 0.4 over a 1 to 300 MHz frequency range.

The input match network 220 provides an impedance match between terminal (IN) and gate (G) of RF transistor 210 at the intended RF operating frequency, which is approximately 2 GHz in this illustration, and the value of capacitor $C_{IN}$ has a substantially negligible contribution to the impedance match. As FIG. 3 illustrates, beginning at 1 GHz, the impedances presented to gate (G) of RF transistors 110/210 by input match networks 120/220 are approximately equivalent. The value of capacitor $C_{IN}$ is selected so that the series combination of resistor $R_{IN}$, inductor $L_{IN2}$ and capacitor $C_{IN}$ substantially reduce the magnitude of the impedance presented to the input of RF transistor 210 over the baseband frequency range at the terminal (IN) of power circuit 200. Curve 320 illustrates that with input match network 220, a maximum impedance is presented to gate (G) of RF transistor 210 of about 6 ohms (at 1 MHz) which is significantly lower than the source impedance of 50 ohms at the terminal (IN) of power circuit 200. In other embodiments, a maximum impedance presented to gate (G) of RF transistor 210 is equal to or less than 20 ohms in the low frequency region. This is illustrated in FIG. 3. In other embodiments, the maximum impedance presented to gate (G) of RF transistor 210 is equal to or less than 20 ohms for frequencies ranging from 1 MHz up to at least one-third of the intended RF operating frequency. Note that curve 310 shows an impedance magnitude that is close to 50 ohms over the low-frequency range. This indicates that the conventional matching circuit, which is a low pass circuit, is having little or no effect on signals in the low-frequency region. For a larger device, for instance a 200 W RF transistor, the maximum impedance presented to the gate of the transistor in the low frequency region may be approximately 10 ohms. Similarly, for a 50 W RF transistor, the maximum impedance presented to the gate of the transistor in the low frequency region may be approximately 40 ohms.

Figure 4:
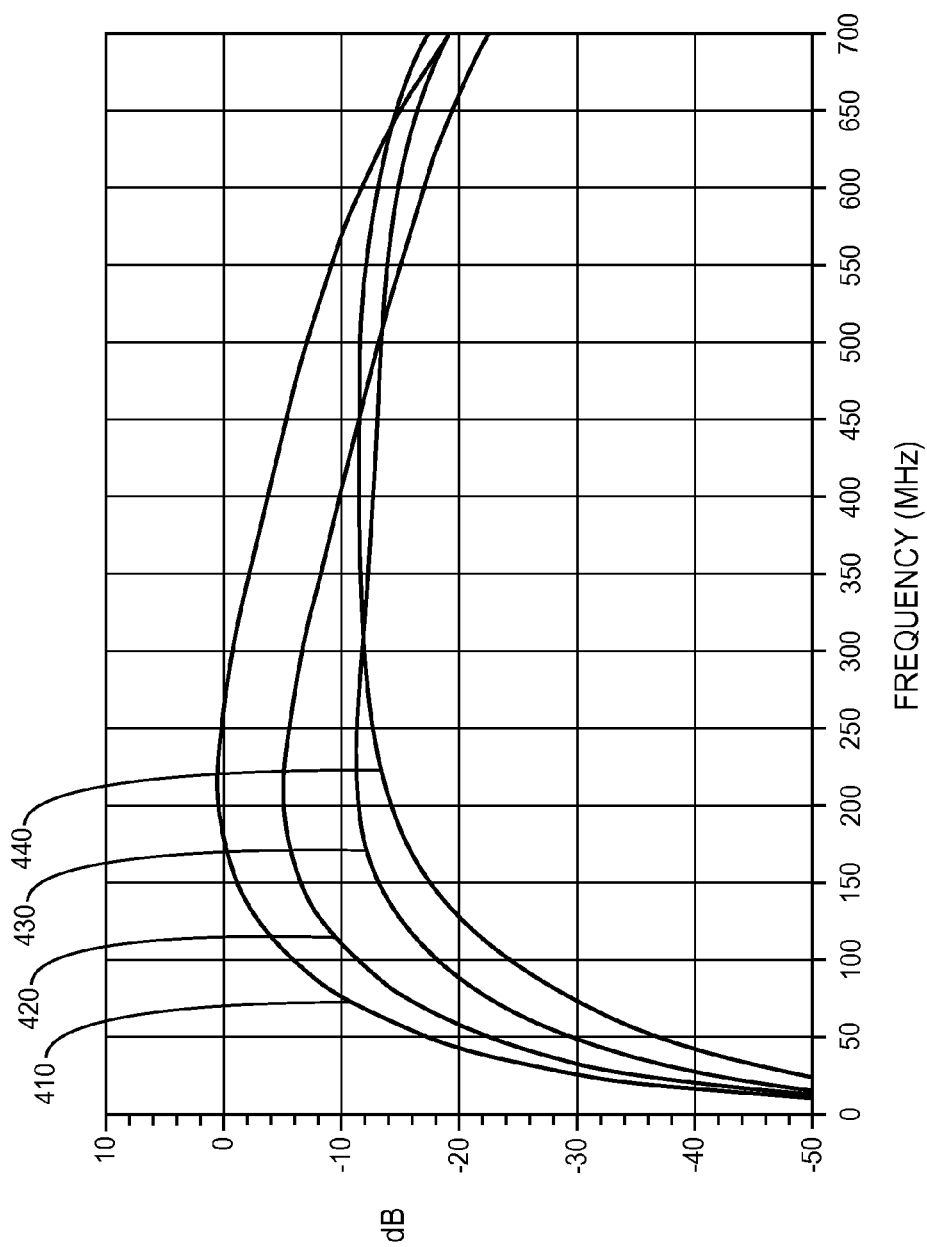
FIG. 4 illustrates embodiments of the gain response of a power circuit as a function of frequency and blocking capacitor value.
Figure 5:
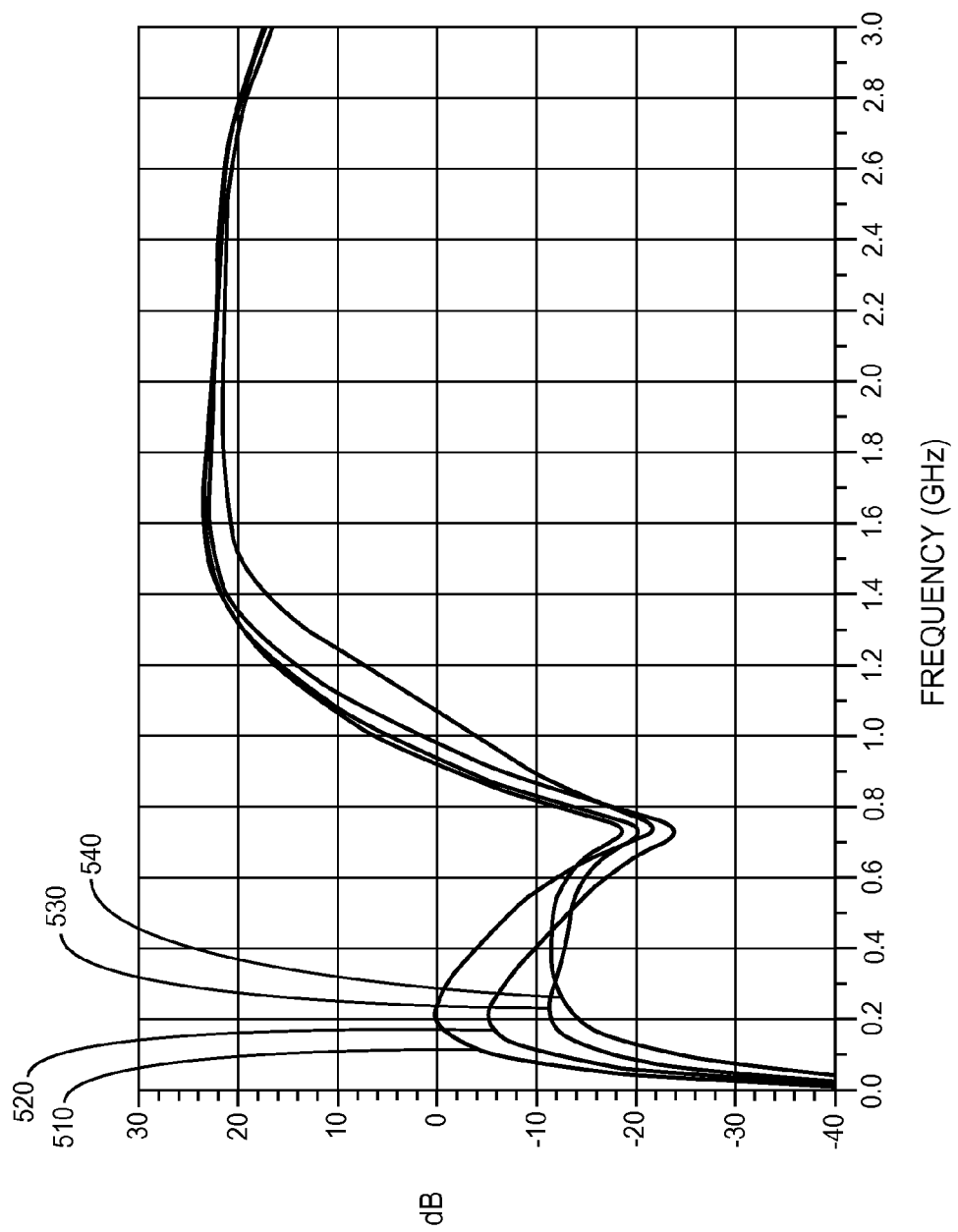
FIG. 5 illustrates embodiments of the gain response of a power circuit as a function of frequency and blocking capacitor value.

FIGS. 4 and 5 illustrate the gain response (dB) of power circuit 200 as a function of the value of blocking capacitor $C_{IN}$ and frequency. FIG. 4 illustrates a frequency range from 0 to 700 MHz which includes the low frequency baseband range of 1 to 300 MHz. FIG. 5 illustrates a frequency range from 0 to 3 GHz which includes both the baseband frequency range and the RF region of operation. Referring to FIG. 4, curve 410 represents a blocking capacitor $C_{IN}$ value of 100 pF, curve 420 represents a blocking capacitor $C_{IN}$ value of 500 pF, curve 430 represents a blocking capacitor $C_{IN}$ value of 1.2 nF, and curve 440 represents a blocking capacitor $C_{IN}$ value of 2 nF. Referring to FIG. 5, curve 510 represents a blocking capacitor $C_{IN}$ value of 100 pF, curve 520 represents a blocking capacitor $C_{IN}$ value of 500 pF, curve 530 represents a blocking capacitor $C_{IN}$ value of 1.2 nF, and curve 540 represents a blocking capacitor $C_{IN}$ value of 2 nF. Referring to FIG. 4 and FIG. 5, for capacitor $C_{IN}$ values of 100 pF (curve 410/510) and 2 nF (curve 440/540), for increasing values of $C_{IN}$ the gain and corresponding gain peak in the baseband range is significantly reduced while the impact of the value of $C_{IN}$ on the gain at the intended RF operating frequency, which is approximately 2 GHz, is much lower and becomes increasingly negligible at higher frequencies.

For a capacitor $C_{IN}$ value of 2 nF (curve 440/540), the gain response peak in the low frequency baseband range of 0 to 300 MHz (see FIG. 4) is about −12 dB while the gain response at the approximate intended RF operating frequency, which is approximately 2 GHz, is about 23 dB. The difference between the gain response peak in the low frequency baseband range and the gain response at the approximate intended RF operating frequency, which for this embodiment is approximately 2 GHz, is about 35 dB for a capacitor $C_{IN}$ value of 2 nF. For a capacitor $C_{IN}$ value of 1.2 nF (curve 430/530), the gain response peak in the low frequency baseband range of 0 to 300 MHz (see FIG. 4) is about −12 dB while the gain response at the approximate intended RF operating frequency, which is approximately 2 GHz, is about 23 dB. The difference between the gain response peak in the low frequency baseband range and the gain response in the approximate center of the high frequency RF region for a capacitor $C_{IN}$ value of 1.2 nF is about 35 dB. For capacitor $C_{IN}$ values of 2.0 nF and 1.2 nF, the gain response peak reduction in the low frequency baseband range has resulted in a difference between the gain response peak in the low frequency baseband range and the gain response at the approximate intended RF operating frequency of about 35 dB. In another embodiment, the difference between the gain response peak in the low frequency baseband range and the gain response at the intended RF operating frequency is about 28 dB. In other embodiments, the high frequency RF region and the intended RF operating frequency can be in the 400 MHz to 4 GHz range. The RF region and the intended RF operating frequency for different applications can be lower or higher than the aforementioned range. Furthermore, the low frequency baseband range for different applications can extend to frequencies that are greater than 300 MHz.

Figure 6:
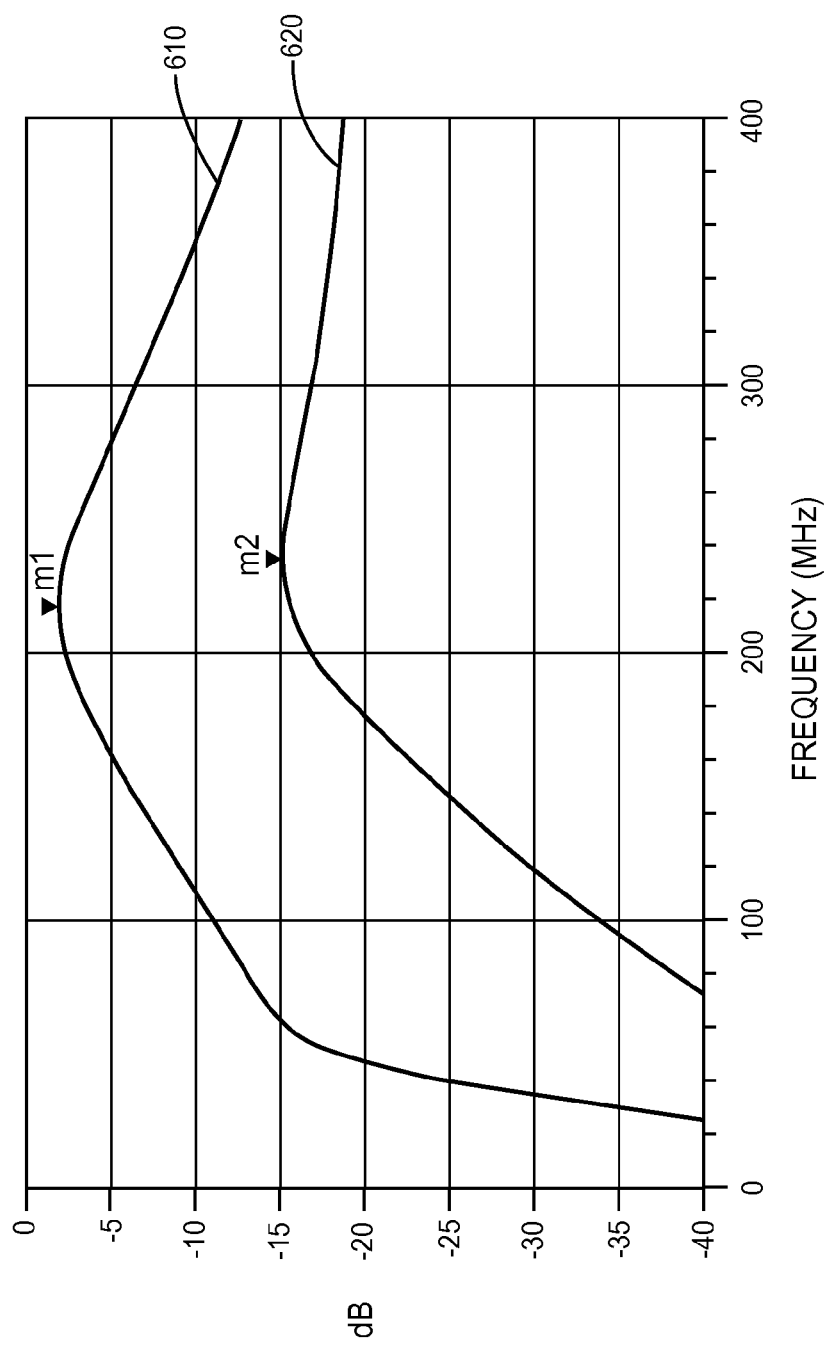
FIG. 6 illustrates the gain response peak attenuation as a function of frequency for the power circuits illustrated in FIG. 1 and FIG. 2.

FIG. 6 illustrates measured results of the gain response of conventional power circuit 100 and an embodiment of power circuit 200 in the baseband frequency range of 0 to 400 MHz. Curve 610 illustrates the gain response for power circuit 100 and curve 620 illustrates the gain response for power circuit 200. In this embodiment of power circuit 200, input match circuit 220 has a blocking capacitor $C_{IN}$ value of 2 nF. For conventional power circuit 100, curve 610 illustrates a gain peak of −2 dB at 217 MHz (refer to m1). For the illustrated embodiment of power circuit 200, curve 620 illustrates a gain peak of −15 dB at 235 MHz (refer to m2). Compared to power circuit 100, power circuit 200 reduces the gain in the baseband region from −2 dB to −15 dB and increases the frequency at which the gain peak occurs from 217 MHz to 235 MHz. Such a reduction in gain peak results in improved DPD system performance for power circuit 200 and improved ruggedness for RF transistor 210.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power circuit, comprising:
   a RF transistor;
   an input match network coupled to an input to the RF transistor and to an input to the power circuit,
   wherein the input match network includes a resistor, an inductor and a capacitor that are coupled together in series between the input to the RF transistor and a ground,
   wherein the values of the resistor and the inductor are selected to match an input impedance of the RF transistor to a source impedance at the input of the power circuit over at least a portion of a high frequency range,
   wherein the value of the capacitor has a substantially negligible contribution to the match at the high frequency range, and wherein the value of the capacitor is selected so that the series combination of the resistor, the inductor and the capacitor substantially reduce the magnitude of the impedance presented to the input of the RF transistor in a low frequency range relative to the source impedance at the input of the power circuit.

2. The power circuit of claim 1, wherein the low frequency range is from about 0 to about 300 MHz.

3. The power circuit of claim 1, wherein the high frequency range is from about 400 MHz to about 4 GHz.

4. The power circuit of claim 1, further comprising:
   an output match network coupled to an output of the RF transistor and to an output to the power circuit,
   wherein a difference between a gain response peak in the baseband range and a gain response at an intended RF operating frequency for the power circuit is equal to or greater than 28 dB.

5. The power circuit of claim 1, wherein a ratio of the magnitude of the impedance presented to the input of the RF transistor to the source impedance at the input of the power circuit over a 1 to 300 MHz frequency range is equal to or less than 0.4.

6. The power circuit of claim 1, wherein a ratio of the magnitude of the impedance presented to the input of the RF transistor to the source impedance at the input of the power circuit over a 1 to 300 MHz frequency range is between about 0.02 and about 0.4.

7. The power circuit of claim 1, wherein the magnitude of the impedance presented to the input of the RF transistor is equal to or less than 20 ohms for frequencies ranging from 1 MHz up to at least one-third of an intended RF operating frequency.

8. The power circuit of claim 1, wherein the RF transistor is a MOS transistor.

9. The power circuit of claim 1, wherein the RF transistor is a LDMOS transistor.

10. The power circuit of claim 1, wherein the RF transistor is a GaN MESFET transistor.

11. An RF power amplifier, comprising:
    an input configured to receive a RF signal having a RF signal bandwidth;
    a LDMOS transistor configured to amplify the RF signal;
    an input match network coupled to the input of the RF power amplifier and a gate of the LDMOS transistor,
    wherein the input match network includes a resistor, an inductor and a capacitor that are coupled together in series between the input of the RF power amplifier and a ground, wherein the values of the resistor and the inductor are selected to match an impedance at the gate of the LDMOS transistor to a source impedance at the input of the RF power amplifier over at least a portion of the RF signal bandwidth, wherein the value of the capacitor has a substantially negligible contribution to the match at the RF signal bandwidth, and wherein the value of the capacitor is selected so that the input match network substantially reduces the magnitude of the impedance presented to the gate of the LDMOS transistor in a baseband frequency range relative to the source impedance at the input of the RF power amplifier.

12. The RF power amplifier of claim 11, wherein the baseband frequency range is from about 0 to about 300 MHz.

13. The RF power amplifier of claim 11, wherein the RF signal bandwidth is from about 400 MHz to about 4 GHz.

14. The RF power amplifier of claim 11, further comprising:

an output match network coupled to a drain of the LDMOS transistor and to an output of the RF power amplifier, wherein a difference between a gain response peak in the baseband frequency range and a gain response in the approximate center of the RF signal bandwidth for the RF power amplifier is equal to or greater than 28 dB.

15. The RF power amplifier of claim 11, wherein a ratio of the magnitude of the impedance presented to the gate of the LDMOS transistor to the source impedance at the input of the RF power amplifier over a 1 to 300 MHz frequency range is equal to or less than 0.4.

16. The RF power amplifier of claim 11, wherein a ratio of the magnitude of the impedance presented to the gate of the LDMOS transistor to the source impedance at the input of the RF power amplifier over a 1 to 300 MHz frequency range is between about 0.02 and about 0.4.

17. The RF power amplifier of claim 11, wherein the magnitude of the impedance presented to the gate of the LDMOS transistor is equal to or less than 20 ohms for frequencies ranging from 1 MHz up to at least one-third of an intended RF operating frequency.

* * * * *